US011973464B2

(12) United States Patent
Qu et al.

(10) Patent No.: US 11,973,464 B2
(45) Date of Patent: Apr. 30, 2024

(54) SOLAR ENERGY-SALINITY GRADIENT ENERGY SYNERGISTIC POWER GENERATION SYSTEM AND METHOD BY USING CONCENTRATING BEAM SPLITTING AND WASTE HEAT RECOVERY

(71) Applicant: XI'AN JIAOTONG UNIVERSITY, Shaanxi (CN)

(72) Inventors: Zhiguo Qu, Shaanxi (CN); Qiang Wang, Shaanxi (CN)

(73) Assignee: XI'AN JIAOTONG UNIVERSITY, Xi'an (CN)

( * ) Notice: Subject to any disclaimer, the term of this patent is extended or adjusted under 35 U.S.C. 154(b) by 0 days.

(21) Appl. No.: 18/144,037

(22) Filed: May 5, 2023

(65) Prior Publication Data

US 2024/0072725 A1    Feb. 29, 2024

(30) Foreign Application Priority Data

Aug. 25, 2022   (CN) .......................... 202211030906.9

(51) Int. Cl.
*H02S 40/44*  (2014.01)
*F28D 20/02*  (2006.01)
*H01L 31/068*  (2012.01)
*H02S 40/22*  (2014.01)
*H02S 40/38*  (2014.01)
*H02S 40/42*  (2014.01)

(52) U.S. Cl.
CPC .............. *H02S 40/44* (2014.12); *F28D 20/02* (2013.01); *H01L 31/0684* (2013.01); *H02S 40/22* (2014.12); *H02S 40/38* (2014.12); *H02S 40/425* (2014.12)

(58) Field of Classification Search
CPC ..... F28D 20/02; H01L 31/0684; H02S 40/44; H02S 40/22; H02S 40/38; H02S 40/425
See application file for complete search history.

(56) References Cited

U.S. PATENT DOCUMENTS

2011/0232724 A1*  9/2011  Duong .................... H02S 40/44
                                                                                136/248

FOREIGN PATENT DOCUMENTS

EP            3643683 A2 *  4/2020  ................ C02F 1/14

* cited by examiner

*Primary Examiner* — Angelo Trivisonno (57) ABSTRACT

Disclosed are a solar energy-salinity gradient energy synergistic power generation system and method by using concentrating beam splitting and waste heat recovery. A concentrating beam splitting photovoltaic power generation unit includes a light mirror, a liquid splitter, a bifacial solar cell, and a waste heat collecting tube; a waste heat recovery unit includes a multi-stage phase-change heat reservoir and a heat exchanger; a salinity gradient power generation unit includes first and second chambers, an ion-selective membrane, first and second electrodes; an electricity storage and control unit includes a battery pack and an inverter; and a water supply unit includes a seawater tank and a river water tank. The bifacial solar cell is used for concentrating beam splitting photovoltaic power generation, nanoparticle-containing seawater and nanoparticle-containing river water flow through the splitter for beam splitting and heating themselves, and the multi-stage phase-change heat reservoir collects heat of the splitter.

16 Claims, 3 Drawing Sheets

SOLAR ENERGY-SALINITY GRADIENT ENERGY SYNERGISTIC POWER GENERATION SYSTEM AND METHOD BY USING CONCENTRATING BEAM SPLITTING AND WASTE HEAT RECOVERY

CROSS-REFERENCE TO RELATED APPLICATION

This application claims priority from the Chinese patent application 2022110309069 filed Aug. 25, 2022, the content of which is incorporated herein in the entirety by reference.

TECHNICAL FIELD

The present disclosure relates to the fields of solar photoelectric-photothermal utilization and ocean energy utilization, and in particular, to a solar energy-salinity gradient energy synergistic power generation system and method by using concentrating beam splitting and waste heat recovery.

BACKGROUND

Solar energy is a widely existing renewable energy source, and the single photovoltaic power generation technology is currently still subject to a bottleneck of low photoelectric efficiency; concentrating photovoltaic power generation can increase photoelectric efficiency and energy density, but concentrating results in a too high local temperature of a solar cell device, and a large amount of waste heat generated is not yet reliably available. In addition, solar radiation is intermittent and unstable under different weather conditions, resulting in the inherent deficiencies of intermittent electrical energy output of the single photovoltaic power generation technology.

Ocean energy is widely found in offshore, islands, and river entries. Seawater has a large amount of salt ion solution, and one of its main utilization forms is salinity gradient power generation. Current single salinity gradient power generation technologies still suffer from complex manufacturing processes for porous ion-selective membranes, poor reliability, and lack of sustainable solution environment regulation modes, resulting in lower output power density. Furthermore, as the ion transmembrane transport process proceeds, the ion concentration difference across the membrane decreases, resulting in a decrease in the driving force for ion migration, and consequently continuous degradation of the electrical energy output. Therefore, the current salinity gradient power generation technologies still require human intervention to constantly replace seawater and river water solutions for maintaining relatively stable power generation performance.

Coupled and complementary utilization of multiple clean energy sources to build a safe, reliable and efficient integrated energy system is an important approach to safeguard national safety and smooth operation of the national economy to achieve the "carbon neutralization" goal.

The above information disclosed in the background section merely serves to enhance the understanding of the background of the present disclosure, and thus may contain information of prior art that is not well known to those of ordinary skill in the art.

SUMMARY

In view of the above problems, an objective of the present disclosure is to provide a solar energy-salinity gradient energy synergistic power generation system and method by using concentrating beam splitting and waste heat recovery, in order to overcome the above deficiencies of the prior art. Nanoparticle-containing seawater and nanoparticle-containing river water are used to beam splitting and heat themselves, a bifacial solar cell is used for concentrating photovoltaic power generation, and meanwhile, a multi-stage phase-change heat reservoir is used to collect heat from a liquid splitter and a waste heat collecting tube and provide heat to a salinity gradient power generation unit stably and continuously. Further, daytime and nighttime operation modes are used to overcome the disadvantages of intermittent photovoltaic power generation and of salinity gradient power generation fluctuation, improving solar energy utilization and electricity output stability. The objective of the present disclosure is achieved by the following technical solution.

A solar energy-salinity gradient energy synergistic power generation system by using concentrating beam splitting and waste heat recovery includes a concentrating beam splitting photovoltaic power generation unit, a waste heat recovery unit, salinity gradient power generation units, an electricity storage and control unit, and a water supply unit.

The concentrating beam splitting photovoltaic power generation unit includes:
  a light mirror having a surface being a parabolic surface that reflects and concentrates sunlight to a liquid splitter;
  a liquid splitter having walls being high-transmittance glass and internal liquid being a nanoparticle-containing seawater solution and a nanoparticle-containing river water solution, the liquid splitter absorbing long-wavelength light for heating the internal liquid and transmitting short-wavelength light;
  a bifacial solar cell having a lower surface for receiving short-wavelength light from the liquid splitter and an upper surface for receiving sunlight; and
  a waste heat collecting tube inside which a heat-carrying working medium circulating collects photovoltaic waste heat and reduces the temperature of the surface of the bifacial solar cell.

The waste heat recovery unit includes:
  a multi-stage phase-change heat reservoir being connected to the liquid splitter and the waste heat collecting tube to collect heat from the liquid splitter and the waste heat collecting tube and store heat, adjusting an output temperature based on salinity gradient power generation demands, and providing heat for seawater and river water solutions of the salinity gradient power generation unit; and
  a heat exchanger being connected to the liquid splitter, the waste heat collecting tube and the salinity gradient power generation unit, room-temperature river water being heated in the heat exchanger by the waste heat collecting tube and the multi-stage phase-change heat reservoir before being introduced into the river water solution of the salinity gradient power generation unit.

Each salinity gradient power generation unit includes:
  a first chamber connecting with the liquid splitter and the multi-stage phase-change heat reservoir, the nanoparticle-containing seawater solution being introduced into the first chamber in a spraying manner from above after being heated by the liquid splitter and the multi-stage phase-change heat reservoir, and then being exported to a seawater tank from a bottom;
  a second chamber connecting with the liquid splitter, the multi-stage phase-change heat reservoir and the heat exchanger, the nanoparticle-containing river water solution is introduced into the second chamber in a spraying manner from above after being heated by the liquid splitter, the multi-stage phase-change heat reservoir and the heat exchanger, and then being exported to a river water tank from the bottom;

a first electrode and a second electrode being located in the first chamber and the second chamber, respectively, to convert electrochemical potential into electrical energy via an electrode reaction; and an ion-selective membrane being located between the first chamber and the second chamber, and including a nanochannel inside.

The electricity storage and control unit includes:

a battery pack being connected to the concentrating beam splitting photovoltaic power generation unit and the salinity gradient power generation unit to store electrical energy generated by the concentrating beam splitting photovoltaic power generation unit and the salinity gradient power generation unit; and an inverter being connected to the battery pack to convert direct current output by the battery pack into alternating current.

The water supply unit includes the seawater tank and the river water tank, which receive outside supplemented seawater and river water respectively, wherein nanoparticles are doped inside the water supply unit to form the seawater solution and the river water solution, respectively.

In the solar energy-salinity gradient energy synergistic power generation system by using concentrating beam splitting and waste heat recovery, the nanoparticle-containing seawater solution and the nanoparticle-containing river water solution are derived from natural seawater and river water after removal of sediment impurities; the seawater solution and the river water solution contain nanoparticles and a plurality of ions, which are driven by a pump to circulate sequentially in the water supply unit, the concentrating beam splitting photovoltaic power generation unit, the waste heat recovery unit, and the salinity gradient power generation unit.

In the solar energy-salinity gradient energy synergistic power generation system by using concentrating beam splitting and waste heat recovery, the nanoparticles are made from one or more high-heat-conductivity nanomaterials including metallic materials or non-metallic materials.

In the solar energy-salinity gradient energy synergistic power generation system by using concentrating beam splitting and waste heat recovery, the waste heat collecting tube is disposed inside the bifacial solar cell to cool the bifacial solar cell by using circulation of the heat-carrying working medium. The material of an active layer of the bifacial solar cell includes gallium arsenide, copper indium gallium selenide, and cadmium telluride, and plasmonic nanoparticles are disposed on a surface of a window layer of the bifacial solar cell.

In the solar energy-salinity gradient energy synergistic power generation system by using concentrating beam splitting and waste heat recovery, the multi-stage phase-change heat reservoir is filled with a plurality of phase-change materials having different phase-change temperatures; meanwhile, the output temperature can be dynamically regulated according to the heat demands of the salinity gradient power generation unit; and the phase-change materials include paraffins, fatty acids, alcohols, lipids and derivatives thereof.

In the solar energy-salinity gradient energy synergistic power generation system by using concentrating beam splitting and waste heat recovery, the heat-carrying working medium is heated through waste heat collecting tube, is subjected to heat storage and temperature control by the multi-stage phase-change heat reservoir, then enters the heat exchanger and transfers heat to the room-temperature river water solution from the river water tank, and the cooled heat-carrying working medium returns to the waste heat collecting tube, forming closed-loop circulation.

In the solar energy-salinity gradient energy synergistic power generation system by using concentrating beam splitting and waste heat recovery, the ion-selective membrane internally includes the nanochannel with an asymmetric structure; a hemichannel on a first chamber side is smaller than a hemichannel on a second chamber side in size; surface charges of the two hemichannels are oppositely charged; the ion-selective membrane has cation selectivity when the hemichannel on the first chamber side has negative surface charges and the hemichannel on the second chamber side has positive surface charges; and the ion-selective membrane has anion selectivity when the hemichannel on the first chamber side has positive surface charges and the hemichannel on the second chamber side has negative surface charges.

In the solar energy-salinity gradient energy synergistic power generation system by using concentrating beam splitting and waste heat recovery, the salinity gradient power generation units are arranged in series, the seawater solution from the seawater tank and the river water solution from the river water tank are heated through the liquid splitter and are subjected to temperature control by the heat reservoir, another part of the river water solution is heated directly through the heat exchanger, and finally the solutions are used for salinity gradient power generation, and are exported to the seawater tank and the river water tank respectively, forming a closed-loop pipeline. Meanwhile, the outside supplemented seawater and river water enter the water supply unit, maintaining an unchanged concentration difference in the first chamber and the second chamber.

A use method of the solar energy-salinity gradient energy synergistic power generation system by using concentrating beam splitting and waste heat recovery includes the following steps:

in a sunny working mode when solar energy is sufficient, enabling a nanoparticle-containing seawater solution and a nanoparticle-containing river water solution from a seawater tank and a river water tank to enter a liquid splitter, concentrating incident sunlight to a surface of the liquid splitter by a light mirror, absorbing long-wavelength concentrated sunlight by the solutions inside the liquid splitter for heating, transmitting short-wavelength concentrated sunlight to a lower surface of a bifacial solar cell for photoelectric conversion to produce electrical energy, receiving the incident sunlight by an upper surface of the bifacial solar cell for photoelectric conversion to produce electrical energy, and storing the electrical energy in a battery pack via wires;

exporting heated seawater solution and river water solution from the liquid splitter respectively to a multi-stage phase-change heat reservoir, transferring part of heat to a phase-change material for heat storage and temperature control, and introducing the seawater solution and the river water solution respectively to heat the first chamber and the second chamber;

collecting photovoltaic waste heat in a waste heat collecting tube by a heat-carrying working medium, then enabling the heat-carrying working medium to enter the multi-stage phase-change heat reservoir for heat storage and temperature control, subsequently, heating the river water solution from the river water tank in a heat exchanger, returning the cooled heat-carrying working medium to the waste heat collecting tube, and introducing the heated river water solution to heat the second chamber;

driving ions in the first chamber at a high concentration by an ion concentration difference to migrate to the second chamber at a low concentration through an ion-selective membrane to form an ion flux, converting the ion flux into external circuit current by a first electrode and a second electrode to achieve salinity gradient power generation, storing electrical energy in a battery pack via wires, supplying power to a pump by the electrical energy of the battery pack via an inverter to drive cyclic transport of the seawater solution, the river water solution, and the heat-carrying working medium;

in a rainy-day and night working mode when solar energy is insufficient, releasing heat stored in the multi-stage phase-change heat reservoir, using the heat as a heat source needed for a salinity gradient power generation unit, enabling the nanoparticle-containing seawater solution and the nanoparticle-containing river water solution from the seawater tank and the river water tank to reach the multi-stage phase-change heat reservoir through the liquid splitter, heating the nanoparticle-containing seawater solution and the nanoparticle-containing river water solution, and introducing the seawater solution and the river water solution respectively to heat the first chamber and the second chamber;

enabling the heat-carrying working medium to enter the multi-stage phase-change heat reservoir through the waste heat collecting tube, heating the heat-carrying working medium, then heating the river water solution from the river water tank in the heat exchanger, returning the cooled heat-carrying working medium to the waste heat collecting tube, and introducing the heated river water solution to heat the second chamber; and driving ions in the first chamber at the high concentration by an ion concentration difference to migrate to the second chamber at the low concentration through the ion-selective membrane to form an ion flux, converting the ion flux into external circuit current by a first electrode and a second electrode to achieve salinity gradient power generation, storing electrical energy in the battery pack via wires, supplying power to a pump by the electrical energy of the battery pack via the inverter to drive cyclic transport of the seawater solution, the river water solution, and the heat-carrying working medium.

Compared to the prior art, the present disclosure has the following advantages.

(1) Solar energy and salinity gradient energy are coupled and complemented and are used for synergistic power generation, the heat-carrying working medium recycles and utilizes concentrating photovoltaic waste heat, to not only avoid performance degradation caused by the local high temperature of the bifacial solar cell and also to increase the overall temperature of a salinity gradient power generation solution, thereby accelerating ion transmembrane migration and increasing ion flux and output voltage. Thus, the system and the method can improve the conversion efficiency of photovoltaic power generation and increase the power density of salinity gradient power generation.

(2) The nanoparticle-containing seawater solution and the nanoparticle-containing river water solution are simultaneously used as electrolytes for concentrating photovoltaic beam-splitting working medium and salinity gradient power generation, circulate in the pipeline of the system and are little supplemented from the outside, thereby maintaining constant ion concentration difference serving as the driving force for ion transmembrane migration in the salinity gradient power generation process, and having significant economics.

(3) The system operates uninterruptedly in two working modes based on real-time weather conditions, i.e., concentrating photovoltaic power generation and salinity gradient power generation in sunny days with sufficient solar energy, wherein heat released from the multi-stage phase-change heat reservoir is used during rainy days and nighttime when solar power is insufficient to continue to improve salinity gradient power generation performance, thereby overcoming the shortcomings of the intermittent single photovoltaic power generation technology and fluctuation of the single salinity gradient power generation technology, achieving stable sustained electrical energy output with important socioeconomic benefits. The system can be applied to renewable energy power generation in estuaries and island areas.

The above description is merely an overview of the technical solutions of the present disclosure. In order to make the technical means of the present disclosure clearer to reach the extent that those skilled in the art can implement the present disclosure according to the content of the description, and to make the above description and other objectives, features and advantages of the present disclosure more obvious and understandable, specific embodiments of the present disclosure are illustrated below.

BRIEF DESCRIPTION OF THE DRAWINGS

Various other advantages and benefits of the present disclosure will become apparent to those of ordinary skill in the art upon reading the following detailed description in the preferred specific embodiments. The drawings of the description are only for the purposes of illustrating the preferred embodiments and are not considered to limit the present disclosure. Obviously, the drawings described below are merely some embodiments of the present disclosure, and those of ordinary skill in the art can obtain other drawings from these drawings without the inventive step. Furthermore, identical parts are denoted by identical reference numerals throughout the drawings.

In the drawings.

wherein 1—river water tank, 2—battery pack, 3—inverter, 4—bifacial solar cell, 5—multi-stage phase-change heat reservoir, 6—heat exchanger, 7—second electrode, 8—second chamber, 9—nanochannel, membrane, 11—first electrode, 12—first chamber, 13—light mirror, 14—second pump, tank, 16—first pump, 17—third pump, 18—fourth pump, 19—fifth pump, 20—waste heat collecting tube, 21—liquid splitter, 22—first valve, 23—second valve, 24—third valve, 25—fourth valve, 26—fifth valve, 27—sixth valve.

The present disclosure is further explained below with reference to the drawings and embodiments.

DETAILED DESCRIPTION

Specific embodiments of the present disclosure will be described in more detail below with reference to FIGS. 1-3. Although the specific embodiments of the present disclosure are shown in the drawings, it should be understood that the present disclosure may be implemented in various forms and should not be limited to the embodiments set forth herein. On the contrary, these embodiments are provided so that the present disclosure may be understood more thoroughly, and may fully convey the scope of the present disclosure to those skilled in the art.

It should be noted that certain words are used in the description and claims to refer to particular components. Those skilled in the art may understand that the skilled person may refer to the same component by different nouns. The description and claims do not use a difference in noun as a way to distinguish the components, but use a difference in function of components as a criterion for the distinction. As referred to throughout the description and claims, "including" or "comprising" is an open-ended term, and thus should be interpreted to mean "including, but not limited to". The following description describes the preferred embodiments for implementing the present disclosure, but is intended for the general principle of the description and is not intended to limit the scope of the present disclosure. The scope of protection of the present disclosure is as defined by the appended claims.

To facilitate the understanding of the embodiments of the present disclosure, specific embodiments will be further described below, by way of example, in conjunction with the drawings, and each of the drawings is not to be construed as limiting the embodiments of the present disclosure.

Figure 1:
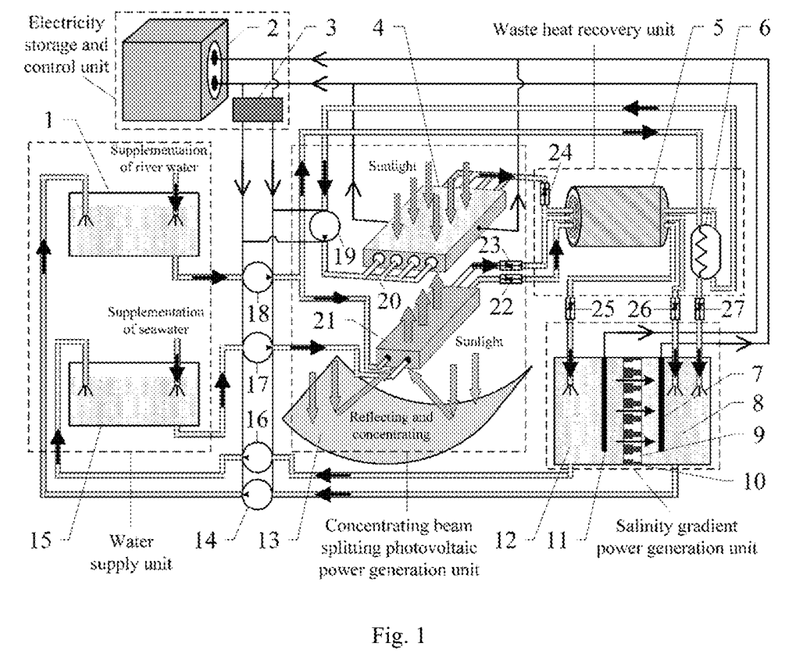
FIG. 1 is a schematic structural diagram of a solar energy-salinity gradient energy synergistic power generation system by using concentrating beam splitting and waste heat recovery according to an embodiment of the present disclosure.

For better understanding, FIG. 1 is a schematic structural diagram of a solar energy-salinity gradient energy synergistic power generation system by using concentrating beam splitting and waste heat recovery according to an embodiment of the present disclosure. As shown in FIG. 1, a solar energy-salinity gradient energy synergistic power generation system by using concentrating beam splitting and waste heat recovery includes a concentrating beam splitting photovoltaic power generation unit, a waste heat recovery unit, a salinity gradient power generation unit, an electricity storage and control unit, and a water supply unit.

In the concentrating beam splitting photovoltaic power generation unit, a surface of a light mirror 13 is parabolic surface, and reflects and concentrates parallel sunlight to a liquid splitter 21.

The liquid splitter 21 has walls being high-transmittance glass, and internal liquid being a nanoparticle-containing seawater solution and a nanoparticle-containing river water solution, and is used for receiving concentrated light and absorbing long-wavelength light for heating the liquid while transmitting short-wavelength light; and the nanoparticle-containing seawater solution and the nanoparticle-containing river water solution are derived from natural seawater and river water after removal of sediment impurities, contain nanoparticles and a plurality of ions, and are driven by a first pump 16, a second pump 14, a third pump 17, a fourth pump 18 and a fifth pump 19 to circulate sequentially in the water supply unit, the concentrating beam splitting photovoltaic power generation unit, the waste heat recovery unit and the salinity gradient power generation unit, thereby avoiding blockage of tubes and membranes due to agglomeration of nanoparticles, and having a beam splitting and absorption effect on incident light when flowing through the liquid splitter 21. The nanoparticles are made from one or more high-heat-conductivity nanomaterials, and the particle size and mass fraction of the nanoparticles can be adjusted according to needs. The nanomaterials include, but are not limited to, metallic materials such as copper, iron, silver, metal oxide materials such as aluminum oxide, copper oxide, ferroferric oxide, zinc oxide, titanium dioxide, non-metallic materials such as silicon dioxide, silicon carbide, carbon nanotubes, boron nitride.

Figure 2:
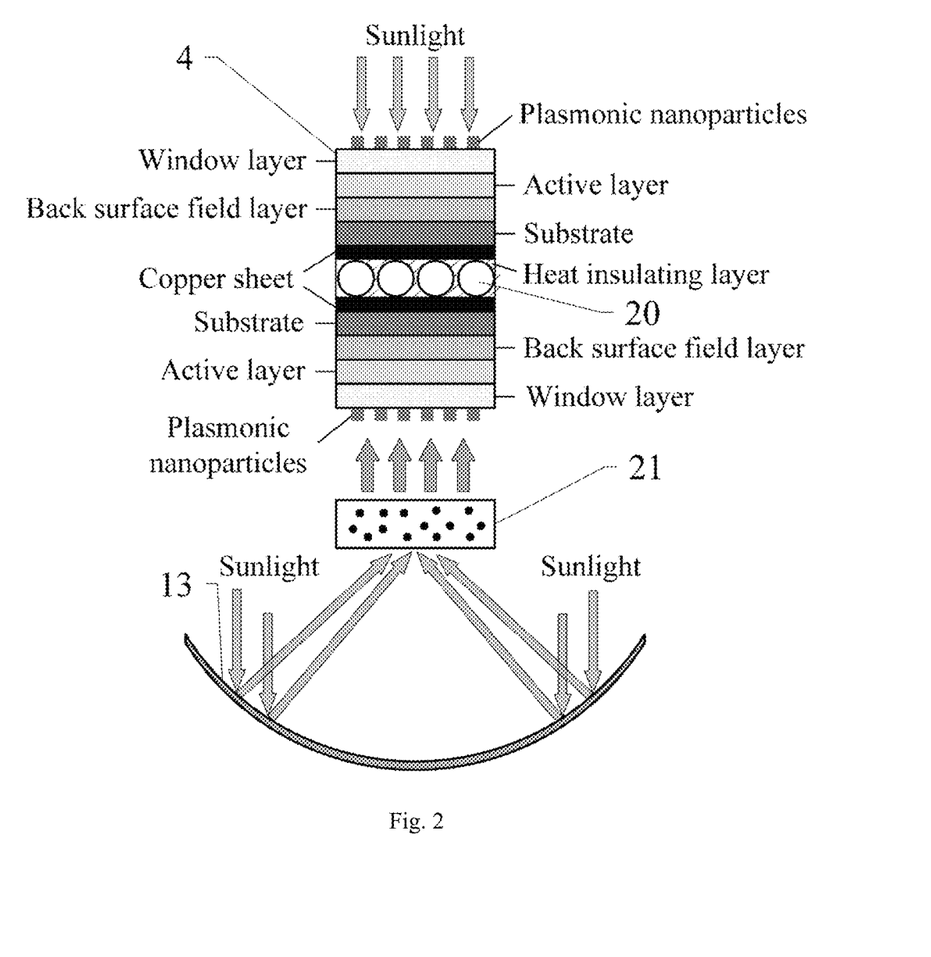
FIG. 2 is a schematic structural diagram of a concentrating beam splitting photovoltaic power generation unit according to an embodiment of the present disclosure.

As shown in FIG. 2, a lower surface of a bifacial solar cell 4 receives short-wavelength concentrated sunlight from the liquid splitter 21, and an upper surface of the bifacial solar cell 4 receives a full-spectrum parallel sunlight; the upper and lower surfaces of the bifacial solar cell 4 simultaneously receive incident light for photovoltaic power generation, reducing light energy loss due to light blockage; a waste heat collecting tube 20 arranged inside cools the bifacial solar cell 4 by using the circulation of a heat-carrying working medium; the material of an active layer material of the bifacial solar cell 4 includes, but is not limited to, gallium arsenide, copper indium gallium selenide, cadmium telluride; plasmonic nanoparticles may be disposed on a surface of a window layer of the bifacial solar cell 4, which may be used for facilitating light trapping and light absorption, reducing recombination losses at the cell surface, and may be spherical, cylindrical or conical in shape.

In the waste heat recovery unit, a multi-stage phase-change heat reservoir 5 collects heat from the liquid splitter 21 through a first valve 22 and a second valve 23, collects heat from the heat collecting tube 20 through a third valve, meanwhile stores heat, dynamically regulates an output temperature based on the heat demands of the salinity gradient power generation unit, provides heat for a first chamber 12 of the salinity gradient power generation unit stably and continuously through a fourth valve 25, provides heat for a second chamber 8 of the salinity gradient power generation unit stably and continuously through a fifth valve 26 and a sixth valve 27; the multi-stage phase-change heat reservoir 5 is internally filled with a plurality of phase-change materials having different phase-change temperatures to cope with the dynamic changes over time in the temperatures of a seawater solution, a river water solution, and a heat-carrying working medium temperatures under different weather conditions such as sunny days, rainy days, and nighttime.

A heat exchanger 6 employs a partition wall type heat exchange mode. Room-temperature river water is heated therein by a high-temperature heat-carrying working medium from the waste heat collecting tube 20 and the multi-stage phase-change heat reservoir 5, and then is introduced into a second chamber 8 of the salinity gradient power generation unit through the sixth valve 27. The heat-carrying working medium is heated through the waste heat collecting tube 20, is subjected to heat storage and temperature control by the multi-stage phase-change heat reservoir 5, then is introduced into the heat exchanger 6 and transfers heat to a room-temperature river water solution from a river water tank 1, and the cooled heat-carrying working medium returns to the waste heat collecting tube 20, forming closed-loop circulation.

Figure 3:
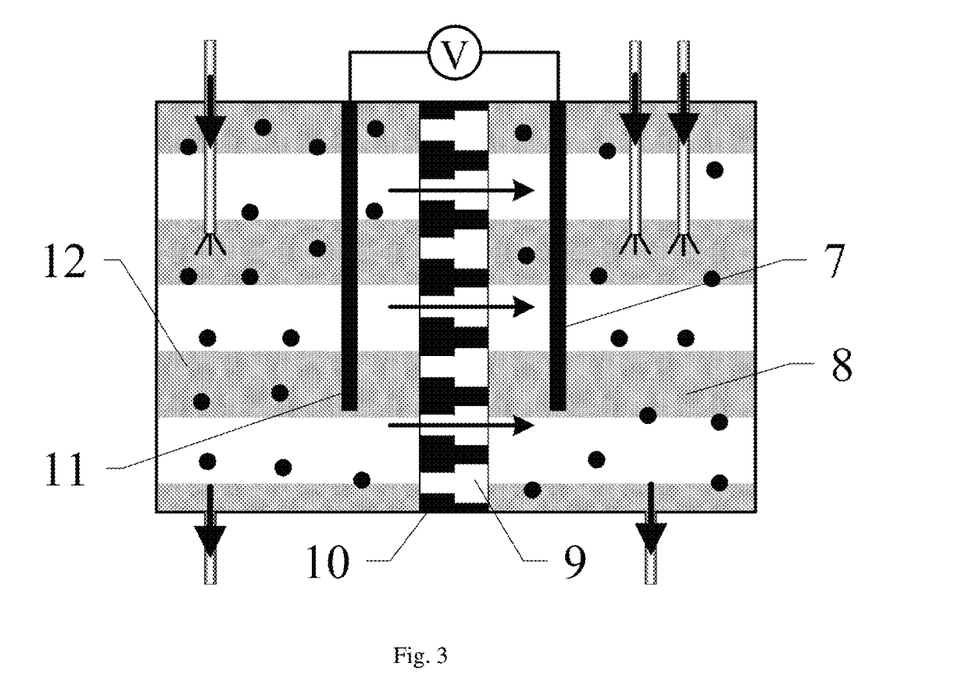
FIG. 3 is a schematic structural diagram of a salinity gradient power generation unit according to an embodiment of the present disclosure.

As shown in FIGS. 1 and 3, in the salinity gradient power generation unit, after being heated by the liquid splitter 21 and the multi-stage phase-change heat reservoir 5, a nanoparticle-containing seawater solution is introduced into a first chamber 12 in a spraying manner from above through the fourth valve 25 to inhibit agglomeration and sedimentation of nanoparticles and promote uniformity of ion concentration and temperature distribution of the seawater solution in the first chamber 12, and is exported from a bottom to a seawater tank 15 by the first pump 16; the nanoparticle-containing river water solution is heated by the liquid splitter 21, the multi-stage phase-change heat reservoir 5 and the heat exchanger 6, is introduced into the second chamber 8 from above in a spraying manner through the fifth valve 26 to inhibit agglomeration and sedimentation of nanoparticles and promote uniformity of ion concentration and temperature distribution of the river water solution in the second chamber 8, and is exported from the bottom to the river water tank 1 by the second pump 14; a first electrode 11 and a second electrode 7 located inside the first chamber 12 and the second chamber 8 respectively convert electrochemical potential into electrical energy by an electrode reaction.

An ion-selective membrane 10 is located between the first chamber 12 and the second chamber 8, and includes a nanochannel 9 with an asymmetric structure. A hemichannel on a first chamber 12 side is small in size to achieve ion selectivity, a hemichannel on a second chamber 8 side is large in size to maintain ion flux, and the specific size is optimally designed according to salinity gradient power generation demands; surface charges of the two hemichannels are electrically opposite; the ion-selective membrane 10 has cation selectivity when the hemichannel on the first chamber 12 side has negative surface charges and the hemichannel on the second chamber 8 side has positive surface charges; and the ion-selective membrane has anion selectivity when the hemichannel on the first chamber 12 side has positive surface charges and the hemichannel on the second chamber 8 side has negative surface charges.

The salinity gradient power generation units may be arranged in series to take full advantage of a large amount of waste heat and increase the output voltage, the in-series number may be adjusted according to the waste heat of the system.

The seawater solution and the river water solution from the seawater tank 15 and the river water tank 1 are driven by the third pump 17 and the fourth pump 18 respectively, enters the liquid splitter 21 to be heated and enters the multi-stage phase-change heat reservoir 5 for temperature control, another part of the river water solution is driven by the fifth pump to be heated directly by the heat exchanger 6, and finally, the solutions are both used for salinity gradient power generation, are exported and are driven by the first pump 16 and the second pumps 14 to enter the seawater tank 15 and the river water tank 1 respectively, forming a closed-loop pipeline. Meanwhile, outside supplemented seawater and river water enter the water supply unit, maintaining a constant concentration difference in the first chamber 12 and the second chamber 8.

In the electricity storage and control unit, a battery pack 2 stores electrical energy generated by the concentrating beam splitting photovoltaic power generation unit and the salinity gradient power generation unit, and an inverter 3 converts a small amount of direct current output by the battery pack 2 into alternating current, and supplies power to the first pump 16, the second pump 14, the third pump 17, the fourth pump 18 and the fifth pump 19.

In the water supply unit, the seawater tank 15 and the river water tank 1 receive a small amount of the outside supplemented seawater and river water respectively, and nanoparticles are doped to form the seawater solution and the river water solution, respectively needed for the operation of the system.

The solar energy-salinity gradient energy synergistic power generation system by using concentrating beam splitting and waste heat recovery has two working modes.

In a sunny working mode when solar energy is sufficient, the nanoparticle-containing seawater solution and the nanoparticle-containing river water solution from the seawater tank 15 and the river water tank 1 are driven by the third pump 17 and the fourth pump 18 respectively to enter the liquid splitter 21; a light mirror 13 concentrates incident parallel sunlight to a surface of the liquid splitter 21; short-wavelength concentrated sunlight is absorbed by the solutions inside the liquid splitter 21 for heating, long-wavelength concentrated sunlight is transmitted to a lower surface of the bifacial solar cell 4 for photoelectric conversion to produce electrical energy, and an upper surface of the bifacial solar cell 4 also receives incident parallel sunlight for photoelectric conversion to produce electrical energy; and the electrical energy is stored in the battery pack 2 via wires;

the heated seawater solution and the river water solution are exported from the liquid splitter 21, enter the multi-stage phase-change heat reservoir 5 through the first valve 22 and the second valve 23 respectively, are subjected to heat storage and temperature control, and are respectively introduced into the first chamber 12 and the second chamber 8 at a suitable temperature through the fourth valve 25 and the fifth valve 26 to heat the first chamber 12 and the second chamber 8 of the salinity gradient power generation unit;

the heat-carrying working medium collects the photovoltaic waste heat in the waste heat collecting tube 20, and then enters the multi-stage phase-change heat reservoir 5 for heat storage and temperature control through the third valve 24; the room-temperature river water solution from the river water tank 1 is driven by the fifth pump 19 to be subjected to partition wall type heat interchange with the high-temperature heat-carrying working medium at the heat exchanger 6; the cooled heat-carrying working medium returns to the heat collecting tube 20, and the heated river water solution is introduced through the sixth valve 27 to heat the second chamber 8 of the salinity gradient power generation unit;

ions in the first chamber 12 at a high concentration are driven by the ion concentration difference to migrate through the nanochannel 9 of the ion-selective membrane 10 to the second chamber 8 at a low concentration to form an ion flux; a first electrode 11 and a second electrode 7 convert the ion flux into external circuit current to achieve salinity gradient power generation; electrical energy is stored in the battery pack 2 via wires, and a small amount of electrical energy from the battery pack 2 supplies power to the first pump 16, the second pump 13, the third pump 17, the fourth pump 18 and the fifth pump 19 via the inverter 3.

In a rainy-day and night working mode when solar energy is insufficient, heat stored in the multi-stage phase-change heat reservoir 5 is released to serve as a heat source needed for the salinity gradient power generation unit; the nanoparticle-containing seawater solution and the nanoparticle-containing river water solution from the seawater tank 15 and the river water tank 1 are driven by the third pump 17 and the fourth pump 18 respectively, pass through the liquid splitter 21, the first valve 22 and the second valve 23 to reach the multi-stage phase-change heat reservoir 5, are heated, and are introduced through the fourth valve 25 and the fifth valve 26 respectively to heat the first chamber 12 and the second chamber 8;

the heat-carrying working medium enters the multi-stage phase-change heat reservoir 5 through the waste heat collecting tube 20 and the third valve 24, is heated and then heats the river water solution that is from the river water tank 1 and is driven by the fifth pump 19 in the heat exchanger 6; the cooled heat-carrying working medium returns to the waste heat collecting tube 20, and the heated river water solution is introduced into the second chamber 8 through the sixth valve 27; and ions in the first chamber 12 are driven by the ion concentration difference to reach the second chamber 8 through the nanochannel 9 of the ion-selective membrane 10 to form an ion flux; the first electrode 11 and the second electrode 7 convert the ion flux into external circuit current to achieve salinity gradient power generation; electrical energy is stored in the battery pack 2 via wires, and a small amount of electrical energy from the battery pack 2 supplies power to the first pump 16, the second pump 13, the third pump 17, the fourth pump 18 and the fifth pump 19 via the inverter 3.

It should be noted that the inventive step of the technology of the present application can be made clear from the above description in principle. The technical effects of the present application are further illustrated below by tests and comparisons of power generation performance. The three selected technologies include the single concentrating photovoltaic power generation technology, the single salinity gradient power generation technology, and the solar energy-salinity gradient energy synergistic power generation system by using concentrating beam splitting and waste heat recovery of the present disclosure.

The single concentrating photovoltaic power technology uses widely studied single-face solar cells, i.e., only the lower surface of the solar cell performs photoelectric conversion and the upper surface of the solar cell is not utilized; the material of the active layer is gallium arsenide; pure water liquid is used as a flowing working medium in the splitter. The single salinity gradient power generation technology uses a currently widely studied graphene oxide membrane as the ion-selective membrane, with cation selectivity; the ion concentration of seawater is 0.5 M, the ion concentration of river water is 0.01 M, and the seawater and the river water do not contain nanoparticles; and the test is carried out at room temperature 25° C.

In the solar energy-salinity gradient energy synergistic power generation system by using concentrating beam splitting and waste heat recovery of the present disclosure, the bifacial solar cell having silver nanoparticles disposed on the upper and lower surfaces is used, the material of the active layer is gallium arsenide, and the waste heat collecting tube is equipped; a carbon nanotube-containing 0.5 M seawater solution and a carbon nanotube-containing 0.01 M river water solution are used as flowing working mediums in the splitter; seawater and river water solutions at 68° C. are introduced into the salinity gradient power generation unit after being heated by the multi-stage phase-change heat reservoir; the ion-selective membrane of the salinity gradient power generation unit employs a graphene oxide membrane and electrodes are Ag/AgCl electrodes.

Four performance indexes for the above three technologies are compared: effective power generation time in 24 hours, surface average temperature of the solar cell, solar cell photoelectric efficiency of the solar cell, salinity gradient power generation density, and the results are shown in Table 1.

TABLE 1

Comparison of performance of three power generation technologies

| Comparative items | Single concentrating photovoltaic power generation | Single salinity gradient power generation | Synergistic power generation system |
|---|---|---|---|
| Effective power generation time in 24 hours | 10 hours | 16 hours | 24 hours |
| Surface average temperature of solar cell | 90° C. | — | 75° C. |
| Photoelectric efficiency of solar cell | 27.8% | — | 30% |
| Salinity gradient power generation density | — | 2.98 W/m$^2$ | 8.60 W/m$^2$ |

As can be seen from the comparison results, the single concentrating photovoltaic power generation technology has the effective power generation time of 10 hours in 24 hours, approaching the light duration of a day. Whereas the single salinity gradient power generation technology has the effective power generation time of 16 hours because the ion concentration difference across the membrane tends to be close so that the output electrical energy is small. The synergistic power generation system of the present disclosure can performs power generation continuously in 24 hours, which, on the one hand, benefits from alternating the two working modes of the system, i.e., performing concentrating photovoltaic power generation and salinity gradient power generation at the same time during a sunny day, heating the solutions and promoting salinity gradient power generation at night using the heat released from the multi-stage phase-change heat reservoir, and on the other hand, benefits from maintaining the substantially constant concentration difference across the membrane by circulation of the seawater and the river water, so that the salinity gradient power generation process does not suffer from performance degradation.

Second, the surface average temperature the solar cell for the single concentrating photovoltaic power reaches 90° C. due to the use of pure water as a beam splitting liquid working medium and the lack of efficient solar cell cooling measures. Under the condition of the same concentration ratio, the synergistic power generation system of the present disclosure uses the nanoparticle-containing seawater solution and the nanoparticle-containing river water solution as beam splitting fluid working mediums and utilizes the waste heat collecting tube to carry away the heat from the solar cell, thus effectively reducing the temperature of the solar cell to 75° C.

In addition, the single concentrating photovoltaic power generation technology has the photoelectric efficiency of 27.8% due to the aforementioned drawbacks, while the present synergistic power generation system has the corresponding efficiency of 30% based on the aforementioned advantages, and the efficiency is maintained or even improved.

Furthermore, the power density of the single salinity gradient power generation technology is only 2.98 W/m$^2$, whereas the synergistic power generation system of the present disclosure has the corresponding power density of 8.60 W/m$^2$, which benefits from the photovoltaic waste heat recovery and the heating effect of the liquid splitter such that the temperatures of the seawater solution and the river water solution for salinity gradient power generation are increased from room temperature to 68° C., greatly promoting the ion flux in the ion-selective membrane.

Although the embodiments of the present disclosure have been described above with reference to the drawings, the present disclosure is not restricted to the above specific embodiments and the field of application, and the above specific embodiments are illustrative and instructional only, and not restrictive. Those of ordinary skill in the art, in the light of the specification and without departing from the scope of the claims of the present disclosure, can take many forms, all of which fall within the scope of the present disclosure.

The invention claimed is:

1. A solar energy-salinity gradient energy synergistic power generation system by using concentrating beam splitting and waste heat recovery, comprising a concentrating beam splitting photovoltaic power generation unit, a waste heat recovery unit, salinity gradient power generation units, an electricity storage and control unit, and a water supply unit, wherein the concentrating beam splitting photovoltaic power generation unit comprises:
a light mirror having a surface being a parabolic surface that reflects and concentrates sunlight to a liquid splitter,
the liquid splitter having walls being high-transmittance glass and internal liquid being a nanoparticle-containing seawater solution and a nanoparticle-containing river water solution, the liquid splitter absorbing long-wavelength light for heating the internal liquid and transmitting short-wavelength light,
a bifacial solar cell having a lower surface for receiving short-wavelength light from the liquid splitter and an upper surface for receiving sunlight, and
a waste heat collecting tube inside which a heat-carrying working medium circulating collects photovoltaic waste heat and reduces the temperature of the lower surface of the bifacial solar cell and the upper surface of the bifacial solar cell;

the waste heat recovery unit comprises:
a multi-stage phase-change heat reservoir being connected to the liquid splitter and the waste heat collecting tube to collect heat from the liquid splitter and the waste heat collecting tube and store heat, adjusting an output temperature based on salinity gradient power generation demands, and providing heat for the nanoparticle-containing seawater solution and the nanoparticle-containing river water solution of the salinity gradient power generation units stably and continuously, and
a heat exchanger being connected to the liquid splitter, the waste heat collecting tube and the salinity gradient power generation units, room-temperature river water being heated in the heat exchanger by the waste heat collecting tube and the multi-stage phase-change heat reservoir before being introduced into the nanoparticle-containing river water solution of the salinity gradient power generation units;

each salinity gradient power generation unit of the salinity gradient power generation units comprises:
a first chamber connecting with the liquid splitter and the multi-stage phase-change heat reservoir, the nanoparticle-containing seawater solution being introduced into the first chamber in a spraying manner from above after being heated by the liquid splitter and the multi-stage phase-change heat reservoir, and then being exported to a seawater tank from a bottom of the first chamber,
a second chamber connecting with the liquid splitter, the multi-stage phase-change heat reservoir and the heat exchanger, the nanoparticle-containing river water solution is introduced into the second chamber in a spraying manner from above after being heated by the liquid splitter, the multi-stage phase-change heat reservoir and the heat exchanger, and then being exported to a river water tank from the bottom,
a first electrode and a second electrode being located in the first chamber and the second chamber respectively, to convert electrochemical potential into electrical energy via an electrode reaction, and
an ion-selective membrane being located between the first chamber and the second chamber, the ion-selective membrane comprising a nanochannel;

the electricity storage and control unit comprises:
a battery pack being connected to the concentrating beam splitting photovoltaic power generation unit and the salinity gradient power generation units to store electrical energy generated by the concentrating beam splitting photovoltaic power generation unit and the salinity gradient power generation units, and
an inverter being connected to the battery pack to convert direct current output by the battery pack into alternating current; and the water supply unit comprises the seawater tank and the river water tank, which receive outside supplemented seawater and river water respectively, wherein nanoparticles are doped inside the water supply unit to form the nanoparticle-containing seawater solution and the nanoparticle-containing river water solution, respectively.

2. The solar energy-salinity gradient energy synergistic power generation system by using concentrating beam splitting and waste heat recovery of claim 1, wherein the nanoparticle-containing seawater solution and the nanoparticle-containing river water solution are derived from natural seawater and river water after removal of sediment impurities; the nanoparticle-containing seawater solution and the nanoparticle-containing river water solution contain a plurality of ions, which are driven by a pump to circulate sequentially in the water supply unit, the concentrating beam splitting photovoltaic power generation unit, the waste heat recovery unit, and the salinity gradient power generation units.

3. The solar energy-salinity gradient energy synergistic power generation system by using concentrating beam splitting and waste heat recovery of claim 2, wherein the nanoparticles are made from one or more high-heat-conductivity nanomaterials comprising metallic materials or non-metallic materials.

4. The solar energy-salinity gradient energy synergistic power generation system by using concentrating beam splitting and waste heat recovery of claim 1, wherein the waste heat collecting tube is disposed inside the bifacial solar cell to cool the bifacial solar cell by using circulation of the heat-carrying working medium; and
the material of an active layer of the bifacial solar cell comprises gallium arsenide, copper indium gallium selenide, and cadmium telluride, and plasmonic nanoparticles are disposed on a surface of a window layer of the bifacial solar cell.

5. The solar energy-salinity gradient energy synergistic power generation system by using concentrating beam splitting and waste heat recovery of claim 1, wherein the multi-stage phase-change heat reservoir is internally filled with a plurality of phase-change materials having different phase-change temperatures; meanwhile, the output temperature can be dynamically regulated according to the heat demands of the salinity gradient power generation units; and the phase-change materials comprise paraffins, fatty acids, alcohols, lipids and derivatives thereof.

6. The solar energy-salinity gradient energy synergistic power generation system by using concentrating beam splitting and waste heat recovery of claim 1, wherein the heat-carrying working medium is heated through the waste heat collecting tube, is subjected to heat storage and temperature control by the multi-stage phase-change heat reservoir, then enters the heat exchanger and transfers heat to the room-temperature nanoparticle-containing river water solution from the river water tank, and the cooled heat-carrying working medium returns to the waste heat collecting tube, forming closed-loop circulation.

7. The solar energy-salinity gradient energy synergistic power generation system by using concentrating beam splitting and waste heat recovery of claim 1, wherein the ion-selective membrane internally comprises the nanochannel with an asymmetric structure; a hemichannel on the first chamber side is smaller than a hemichannel on the second chamber side in size; surface charges of the two hemichannels are electrically opposite; the ion-selective membrane has cation selectivity when the hemichannel on the first chamber side has negative surface charges and the hemichannel on the second chamber side has positive surface charges; and the ion-selective membrane has anion selectivity when the hemichannel on the first chamber side has positive surface charges and the hemichannel on the second chamber side has negative surface charges.

8. The solar energy-salinity gradient energy synergistic power generation system by using concentrating beam splitting and waste heat recovery of claim 1, wherein the salinity gradient power generation units are arranged in series, the nanoparticle-containing seawater solution from the seawater tank and the nanoparticle-containing river water solution from the river water tank are heated through the liquid splitter and are subjected to temperature control by the heat reservoir, part of the nanoparticle-containing river water solution is heated directly through the heat exchanger, and finally the nanoparticle-containing river water solution and the nanoparticle-containing seawater solution are used for salinity gradient power generation, and are exported to the seawater tank and the river water tank respectively, forming a closed-loop pipeline; and meanwhile, the outside supplemented seawater and river water enter the water supply unit, maintaining a constant concentration difference in the first chamber and the second chamber.

9. A use method of the solar energy-salinity gradient energy synergistic power generation system by using concentrating beam splitting and waste heat recovery of claim 1, comprising the following steps:

in a sunny working mode when solar energy is sufficient, enabling the nanoparticle-containing seawater solution and the nanoparticle-containing river water solution from the seawater tank and the river water tank to enter the liquid splitter, concentrating incident sunlight to a surface of the liquid splitter by the light mirror, absorbing long-wavelength concentrated sunlight by the solutions inside the liquid splitter for heating, transmitting short-wavelength concentrated sunlight to the lower surface of the bifacial solar cell for photoelectric conversion to produce electrical energy, receiving the incident sunlight by the upper surface of the bifacial solar cell for photoelectric conversion to produce electrical energy, and storing the electrical energy in the battery pack via wires;

exporting heated nanoparticle-containing seawater solution and nanoparticle-containing river water solution from the liquid splitter respectively to the multi-stage phase-change heat reservoir, transferring part of heat to a phase-change material for heat storage and temperature control, and introducing the nanoparticle-containing seawater solution and the nanoparticle-containing river water solution respectively to heat the first chamber and the second chamber;

collecting photovoltaic waste heat in the waste heat collecting tube by the heat-carrying working medium, then enabling the heat-carrying working medium to enter the multi-stage phase-change heat reservoir for heat storage and temperature control, subsequently, heating the nanoparticle-containing river water solution from the river water tank in the heat exchanger, returning the cooled heat-carrying working medium to the waste heat collecting tube, and introducing the heated nanoparticle-containing river water solution to heat the second chamber;

driving ions in the first chamber at a high concentration by an ion concentration difference to migrate to the second chamber at a low concentration through the ion-selective membrane to form an ion flux, converting the ion flux into external circuit current by the first electrode and the second electrode to achieve salinity gradient power generation, storing electrical energy in the battery pack via the wires, supplying power to a pump by the electrical energy of the battery pack via an inverter to drive cyclic transport of the nanoparticle-containing seawater solution, the nanoparticle-containing river water solution, and the heat-carrying working medium;

in a rainy-day and night working mode when solar energy is insufficient, releasing heat stored in the multi-stage phase-change heat reservoir, using the heat as a heat source needed for the salinity gradient power generation unit, enabling the nanoparticle-containing seawater solution and the nanoparticle-containing river water solution from the seawater tank and the river water tank to reach the multi-stage phase-change heat reservoir through the liquid splitter, heating the nanoparticle-containing seawater solution and the nanoparticle-containing river water solution, and introducing the nanoparticle-containing seawater solution and the nanoparticle-containing river water solution to heat the first chamber and the second chamber respectively;

enabling the heat-carrying working medium to enter the multi-stage phase-change heat reservoir through the waste heat collecting tube, heating the heat-carrying working medium, then heating the nanoparticle-containing river water solution from the river water tank in the heat exchanger, returning the cooled heat-carrying working medium to the waste heat collecting tube, and introducing the heated nanoparticle-containing river water solution to heat the second chamber; and driving ions in the first chamber at the high concentration by the ion concentration difference to migrate to the second chamber at the low concentration through the ion-selective membrane to form the ion flux, converting the ion flux into external circuit current by the first electrode and the second electrode to achieve salinity gradient power generation, storing electrical energy in the battery pack via the wires, supplying power to a pump by the electrical energy of the battery pack via the inverter to drive cyclic transport of the nanoparticle-containing seawater solution, the nanoparticle-containing river water solution, and the heat-carrying working medium.

10. The use method of the solar energy-salinity gradient energy synergistic power generation system by using concentrating beam splitting and waste heat recovery of claim 9, wherein the nanoparticle-containing seawater solution and the nanoparticle-containing river water solution are derived from natural seawater and river water after removal of sediment impurities; the nanoparticle-containing seawater solution and the nanoparticle-containing river water solution contain a plurality of ions, which are driven by the pump to circulate sequentially in the water supply unit, the concentrating beam splitting photovoltaic power generation unit, the waste heat recovery unit, and the salinity gradient power generation unit.

11. The use method of the solar energy-salinity gradient energy synergistic power generation system by using concentrating beam splitting and waste heat recovery of claim 9, wherein the nanoparticles are made from one or more high-heat-conductivity nanomaterials comprising metallic materials or non-metallic materials.

12. The use method of the solar energy-salinity gradient energy synergistic power generation system by using concentrating beam splitting and waste heat recovery of claim 9, wherein the waste heat collecting tube is disposed inside the bifacial solar cell to cool the bifacial solar cell by using circulation of the heat-carrying working medium; and the material of an active layer of the bifacial solar cell comprises gallium arsenide, copper indium gallium selenide, and cadmium telluride, and plasmonic nanoparticles are disposed on a surface of a window layer of the bifacial solar cell.

13. The use method of the solar energy-salinity gradient energy synergistic power generation system by using concentrating beam splitting and waste heat recovery of claim 9, wherein the multi-stage phase-change heat reservoir is internally filled with a plurality of phase-change materials having different phase-change temperatures; meanwhile, the output temperature can be dynamically regulated according to the heat demands of the salinity gradient power generation unit; and the phase-change materials comprise paraffins, fatty acids, alcohols, lipids and derivatives thereof.

14. The use method of the solar energy-salinity gradient energy synergistic power generation system by using concentrating beam splitting and waste heat recovery of claim 9, wherein the heat-carrying working medium is heated through the waste heat collecting tube, is subjected to heat storage and temperature control by the multi-stage phase-change heat reservoir, then enters the heat exchanger and transfers heat to the room-temperature nanoparticle-containing river water solution from the river water tank, and the cooled heat-carrying working medium returns to the waste heat collecting tube, forming closed-loop circulation.

15. The use method of the solar energy-salinity gradient energy synergistic power generation system by using concentrating beam splitting and waste heat recovery of claim 9, wherein the ion-selective membrane internally comprises the nanochannel with an asymmetric structure; a hemichannel on the first chamber side is smaller than a hemichannel on the second chamber side in size; surface charges of the two hemichannels are electrically opposite; the ion-selective membrane has cation selectivity when the hemichannel on the first chamber side has negative surface charges and the hemichannel on the second chamber side has positive surface charges; and the ion-selective membrane has anion selectivity when the hemichannel on the first chamber side has positive surface charges and the hemichannel on the second chamber side has negative surface charges.

16. The use method of the solar energy-salinity gradient energy synergistic power generation system by using concentrating beam splitting and waste heat recovery of claim 9, wherein the salinity gradient power generation units are arranged in series, the nanoparticle-containing seawater solution from the seawater tank and the nanoparticle-containing river water solution from the river water tank are heated through the liquid splitter and are subjected to temperature control by the heat reservoir, another part of the nanoparticle-containing river water solution is heated directly through the heat exchanger, and finally the solutions are used for salinity gradient power generation, and are exported to the seawater tank and the river water tank respectively, forming the closed-loop pipeline; and meanwhile, the outside supplemented seawater and river water enter the water supply unit, maintaining a constant concentration difference in the first chamber and the second chamber.

* * * * *